(12) United States Patent
Mohammad et al.

(10) Patent No.: US 11,830,846 B2
(45) Date of Patent: Nov. 28, 2023

(54) HEATED PINS TO COUPLE WITH SOLDER ELEMENTS

(71) Applicant: Intel Corporation, Santa Clara, CA (US)

(72) Inventors: Feroz Mohammad, Chandler, AZ (US); Srinivasa R. Aravamudhan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1024 days.

(21) Appl. No.: 16/424,227

(22) Filed: May 28, 2019

(65) Prior Publication Data

US 2020/0381388 A1 Dec. 3, 2020

(51) Int. Cl.
*H01L 23/498* (2006.01)
*H01L 23/00* (2006.01)
*H01L 23/34* (2006.01)

(52) U.S. Cl.
CPC ............ *H01L 24/81* (2013.01); *H01L 23/345* (2013.01); *H01L 23/49811* (2013.01); *H01L 24/16* (2013.01); *H01L 24/98* (2013.01); *H01L 2224/16238* (2013.01); *H01L 2224/81234* (2013.01); *H01L 2224/81815* (2013.01)

(58) Field of Classification Search
CPC ....... H01L 23/00; H01L 23/34; H01L 23/498; H01L 23/345; H01L 23/49811; H01L 23/19816; H01L 24/16; H01L 24/81; H01L 24/98; H01L 25/00; H01L 25/10; H01L 25/50; H01L 25/105; H01L 21/48; H01L 21/4853; H01L 2224/16238; H01L 2224/81234; H01L 2224/81815; H01L 2225/1058; H01L 2225/1088; H01L 2924/15311; H01L 29/868; H01L 2924/12031; H01L 2224/1623; H01L 2224/3223; H01L 2224/4823

USPC ........................................................ 257/738
See application file for complete search history.

(56) References Cited

U.S. PATENT DOCUMENTS

| | | | |
|---|---|---|---|
| 2005/0253614 A1* | 11/2005 | Maruyama | G01R 1/0735 324/750.11 |
| 2009/0178275 A1* | 7/2009 | Dang | H01L 23/147 29/832 |
| 2016/0255728 A1* | 9/2016 | Kanda | H01L 23/367 361/767 |
| 2018/0252747 A1* | 9/2018 | Liu | G01R 1/07364 |

* cited by examiner

*Primary Examiner* — Chuong A Luu
(74) *Attorney, Agent, or Firm* — Schwabe, Williamson & Wyatt, P.C.

(57) ABSTRACT

Embodiments herein relate to systems, apparatuses, or processes for coupling or decoupling two substrates by heating pins on one of the substrates and either inserting or withdrawing the heated pins from solder elements on a BGA. In particular, by heating a plurality of pins on a first side of a first substrate, where the plurality of pins are substantially perpendicular to a plane of the substrate, inserting the heated plurality of pins into BGA attached to a second substrate where the BGA includes a plurality of solder elements aligned with the plurality of pins and where the heated plurality of pins melt the plurality of solder elements upon insertion. The inserted plurality of pins physically and/or electrically couple the first substrate and the second substrate.

24 Claims, 8 Drawing Sheets

HEATED PINS TO COUPLE WITH SOLDER ELEMENTS

FIELD

Embodiments of the present disclosure generally relate to the field of package assemblies, and in particular package assemblies with socket pins to couple with a ball grid array (BGA).

BACKGROUND

Continued increase in the end product power and input-output connections in server electronic devices is a driving force for development of socket interconnect with increased performance and reduced cost.

DETAILED DESCRIPTION

Figure 1:
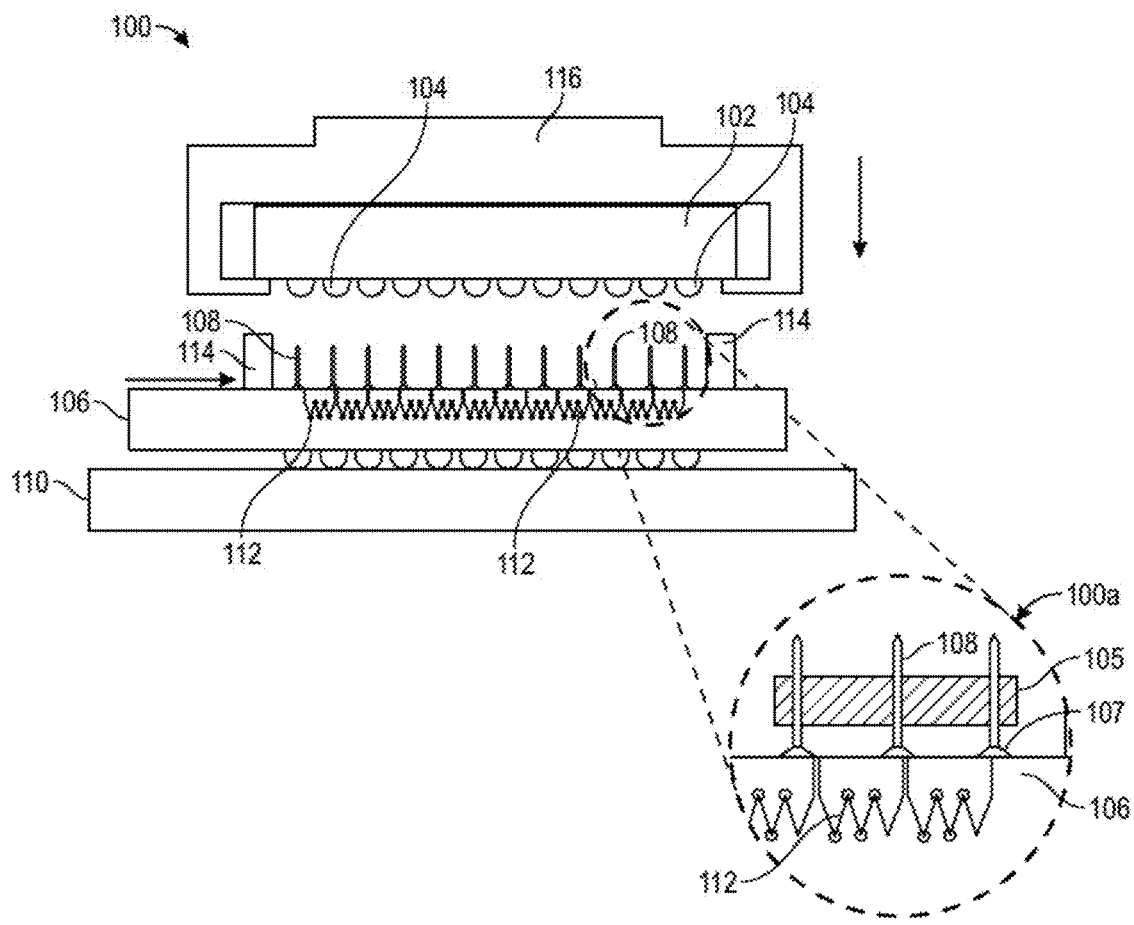
FIG. 1 illustrates an example of heated pins on an interposer to be coupled with a BGA package, in accordance with embodiments.

Embodiments of the present disclosure may generally relate to systems, apparatus, and/or processes directed to substrate with a plurality of pins substantially perpendicular to a plane of the substrate, where the plurality of pins when heated are to physically couple with or physical decouple from a plurality of solder elements when the heated plurality of pins are inserted into or removed from the plurality of solder elements. In embodiments, the substrate that includes the pins may be an interposer that may be physically and electrically coupled with a PCB. Embodiments may provide an alternative to the legacy socket architecture that may be used for low insertion-removal cycle situations for attaching chips to a substrate.

In legacy implementations, particularly for high pin count central processing unit (CPU) applications, legacy techniques include using a land grid array (LGA). Scalability of current LGA technology is limited with increasing pin count due to increase in retention load with increasing pins. The increase in retention load increases the space required for spring hardware in server chassis which is limited in dense system architectures. Also, the power delivery and signal integrity performance may not be sufficient for future CPU needs. For increased power delivery performance, an interconnect with lower resistance the LGA is required. For improved signal integrity a simpler vertical interconnect is beneficial.

Embodiments of the techniques include a substrate such as an interposer or a PCB with embedded trace heaters and pins attached on the side of the substrate, where the trace heaters are thermally coupled with the pins. A current is applied to the heaters to heat the pins which in-turn heats the solder elements, which may also be referred to as solder balls. Another substrate such as a chip or a package that includes BGA with solder elements is placed on top of the pins. The solder elements then melt and reflow to form a secure physical and electrical joint with the pins. The chip or package can then be subsequently detached or removed by heating the pins again through the heater and physically separating the BGA on the chip or package from the pins.

In other embodiments, an inductive coil may be used to heat the pins, or a thermally conductive element may conduct heat external to the pins. In embodiments, a separate tool may be used that attaches to the chip or package with the BGA to be inserted or removed. This tool may provide alignment, heat generation, or other portions of technique embodiments.

Applying these techniques described herein may increase scalable signal integrity. Using heated pins to couple with a BGA results in a simple vertical interconnect with the BGA that may result in reduced insertion loss and cross talk and an improved power delivery path. For example, the simple vertical resistance may be less than 4 mega ohm (mohm) per pin in contrast to 23 mohm per pin for LGA socket. Thus, techniques described herein may result in increased current carrying capability with reduced power loss. In addition, simple vertical interconnects reduce chip form factor and can be packed at smaller pitches to achieve higher density at a lower cost. In contrast, legacy LGA socket interconnects with cantilever beams may result in pin to pin shorting when pin pitch is reduced.

In addition, the resulting simple vertical interconnects may reduce motherboard keep out zones by reducing motherboard real estate needed for package coupling. Unlike legacy LGA sockets, simple vertical interconnects do not require legacy retention load hardware that takes up space and takes additional motherboard real estate. In addition, cost savings may be realized because vertical pin interconnects can be manufactured in fewer steps than the cantilever beam design of an LGA pin. Additionally, LGA pins require gold coating while simple vertical pin interconnects do not.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates an example of heated pins on an interposer to be coupled with a BGA package, in accordance with embodiments. Diagram 100 shows a package 102 with BGA solder 104 to physically and/or electrically couple the package 102 to an interposer 106 that has a plurality of pins 108. In embodiments, the package 102 may be a CPU, a chip, or some other device to be attached to the interposer 106. In embodiments, the interposer 106 may generally be a substrate, or a portion of some other device to which the package 102 is to be coupled. In embodiments, the interposer 106 may be coupled with a PCB 110. In embodiments, the interposer 106 may be a PCB, such as a motherboard or some other substrate.

In embodiments, the pins 108 are aligned with the solder elements of the BGA 104. In embodiments, heaters 112 may be embedded within the interposer 106, and may be thermally coupled to one or more of the pins 108. When the heaters 112 are energized or activated, for example when electric current is applied, the pins 108 increase in temperature until they are hot enough to melt any BGA solder 104 to which a pin 108 may come into contact or into close proximity. In embodiments, the package 102 and the interposer 106 will be electrically and physically coupled after the pins 108 are heated and inserted into the BGA solder 104.

In embodiments, the controller tool 116 may be attached to the package 102 to help guide and/or secure the BGA solder 104 into the pins 108. When the pins 108 are heated, the package 102 may be pressed together with the interposer 106. In embodiments, there may be alignment features 114 coupled with the interposer 106 to facilitate alignment when package 102 is coupled with interposer 106. In embodiments, other alignment features (not shown) may be coupled with the package 102.

In embodiments, the controller tool 116 may have alignment features (not shown) that may interact with the alignment features 114 that are coupled with interposer 106. In embodiments, the alignment features 114 may be protrusions as shown, or may be other shapes, such as recesses or indentations within the interposer 106 (not shown).

In embodiments, the pins 108 may be heated by a technique other than embedded heaters 112. For example, an inductive coil (not shown) may be a part of the controller tool 116 and when activated, the inductive coil may cause current eddies within the pins 108 causing the pins 108 to heat up. In another example, a thermally conductive path (not shown) along the interposer 106 may thermally couple a thermal edge connector (not shown) on the interposer 106 with the pins 108. In embodiments, the controller tool 116 may provide thermal energy to the thermal edge connector thus heating the pins 108. In other embodiments, the interposer 106 that includes the pins 108 may be placed into an oven to heat the pins 108 to the proper temperature.

For coupling the package 102 with the interposer 106, the BGA solder 104 may be aligned with and placed on top of the pins 108. The pins 108 are heated, which melts the BGA solder 104 that are in contact or are in close proximity to the pins 108. As a result, an electrical joint is formed between the BGA solder 104 and the pins 108. Similarly, the package 102 may be removed from the interposer 106 by heating the pins 108 and pulling the package 102 up and away from the pins 108.

In embodiments, the temperature of the pins 108 required to couple or decouple the package 102 from the interposer 106 depends upon the heat profile of the BGA solder 104. The melting point of the solder elements 104 should not be too low, for example below 110°. If the operational temperature of the system exceeds the temperature at which the BGA solder 104 begins to melt may cause the device to separate and/or BGA solder 104 to begin to reflow and cause reliability issues due to an intended electrical connections. On the other hand, if the temperature at which the BGA solder 104 begins to melt is too high, then heating the BGA solder 104 may cause heat damage to the package 102, interposer 106, or other proximate components.

Diagram 100a shows a detail of pins 108 attached interposer 106. In embodiments, a plastic carrier 105 may be used to evenly space the pins 108 to keep them in a particular orientation with respect to the interposer 106 (e.g. perpendicular to a plane of the interposer 106). In addition, at the base of the pin 108 there may be a pad 107 either on the surface or inside the interposer 106. The pad 107 may be thermally coupled to the heater 112 and to the pin 108. In embodiments, the pin 108 as shown may come to a point. In other embodiments, the pin 108 may be a cylinder (not shown).

Figure 2:
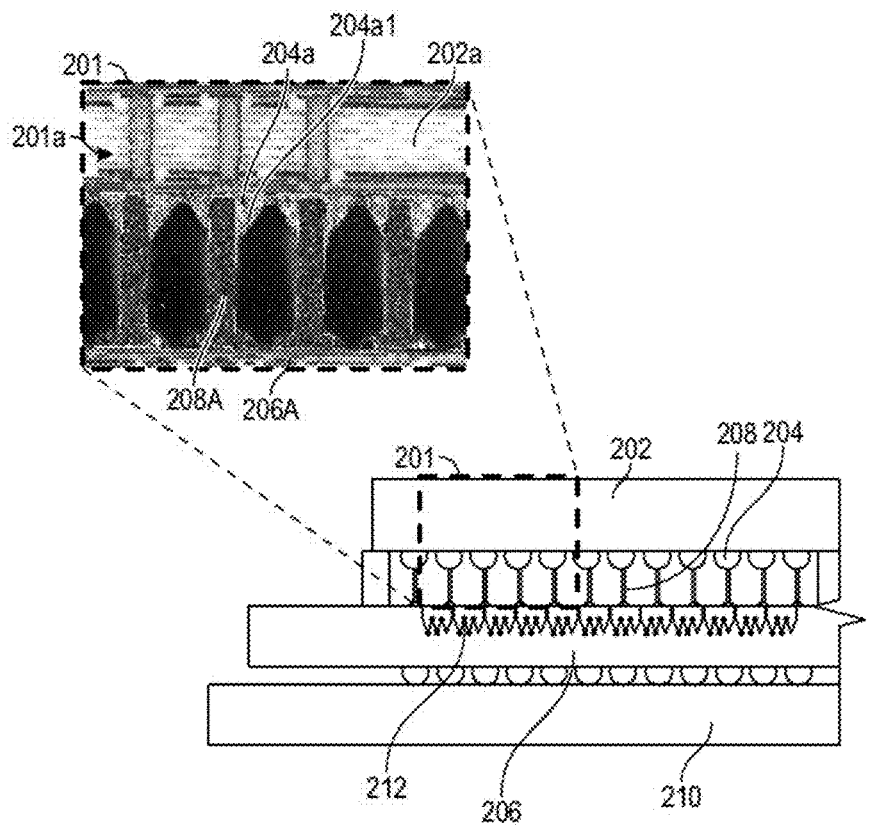
FIG. 2 illustrates an example cross-section of heated pins inserted into solder elements of a BGA, in accordance with embodiments.

FIG. 2 illustrates an example cross-section of a heated pins inserted into solder elements of a BGA, in accordance with embodiments. Package 202, pins 208, interposer 206, BGA solder 204, heating elements 212, and PCB 210 may be similar to package 102, pins 108, interposer 106, BGA solder 104, heating elements 112, and PCB 110 to FIG. 1 as shown and described above. Section 201, which is shown by a dotted rectangle is exploded as an example image 201a that shows a cross-section of an actual package 202a, that may be similar to package 202, that is physically coupled to the interposer 206a by way of pins 208a, which may be similar to pins 208, by BGA solder 204a which may be similar to BGA solder 204.

The image 201a is the result of pins 208a being heated, for example by heating elements 212, and then inserted into BGA solder 204a. As shown, during insertion, the BGA solder 204a melted to allow the pins 208a to move into the BGA solder 204a. In addition, the BGA solder 204a surrounded and traveled partially down the pins 208a, as shown by individual BGA solder element 204a1. After cooling, the interposer 206a will be electrically coupled and physically coupled with the package 202a.

In embodiments, once the pins 208 have been heated, the speed of withdrawal of the pins 208 from the BGA solder 204 is to be controlled. If the speed of withdrawal of the pins 208 is too slow, an "icicle" formation (not shown) of solder may form on the upper edge or the tip of the pin 208 and edge of the BGA solder 204. If the speed of withdrawal of the pins is too rapid, the resulting BGA solder 204 formation may not return to a ball-like shape, but instead may have a different shape or indentation.

Figure 3:
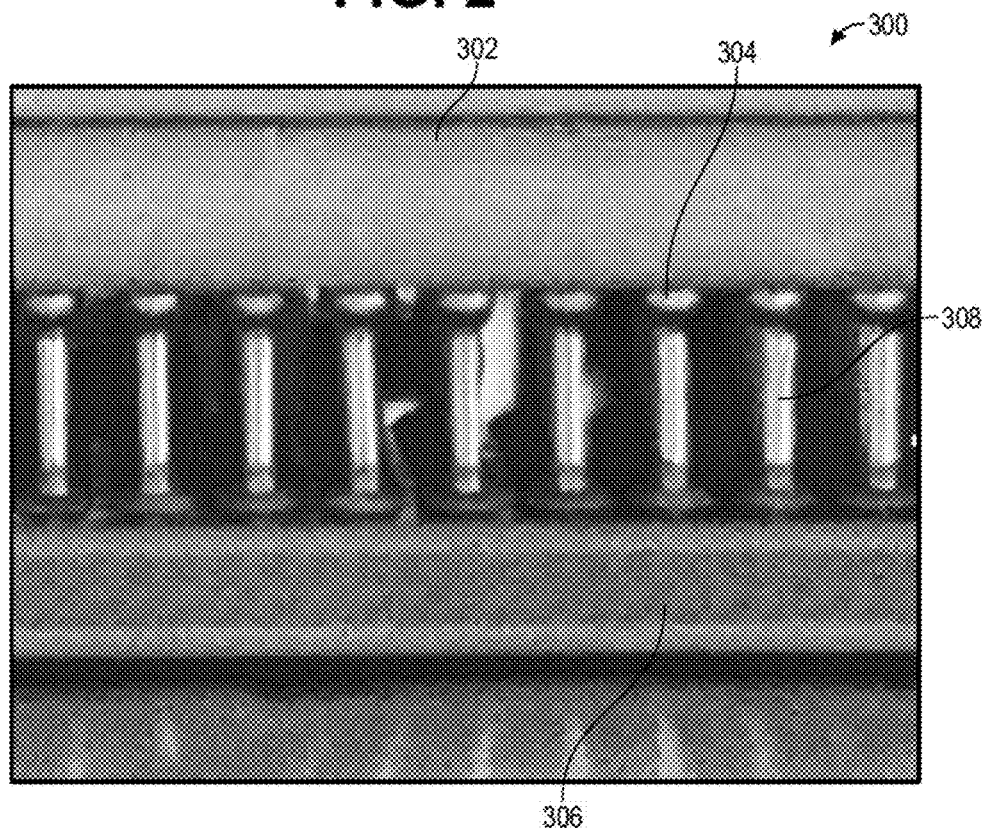
FIG. 3 illustrates an example of a processor with a plurality pins to be attached to a printed circuit board (PCB) with a plurality of solder elements in a ball grid array (BGA), in accordance with embodiments.

FIG. 3 illustrates an example of a substrate with heated pins inserted into a package with a BGA, in accordance with embodiments. Diagram 300 is a side view image of a package 302, which may be similar to package 202 of FIG. 2, that includes BGA solder 304, which may be similar to BGA solder 204 of FIG. 2. An interposer 306, which may be similar to interposer 206 of FIG. 2, has a plurality of pins 308, which may be similar to pins 208 of FIG. 2, that are heated by heater elements (not shown) but which may be similar to heater elements 212 of FIG. 2. As shown, the pins 308 are inserted into the BGA solder 304 and are beginning to press in toward the package 302. The BGA solder 304 is beginning to melt and to deform as the pins 308 are being inserted. Depending upon the speed of insertion and the shape of the head of the pins 308, the BGA solder 304 may initially deform from an original ball-like shape until the pins 308 break the surface tension of the BGA solder 304 and are inserted into the BGA solder 304, as described further below.

Figure 4:
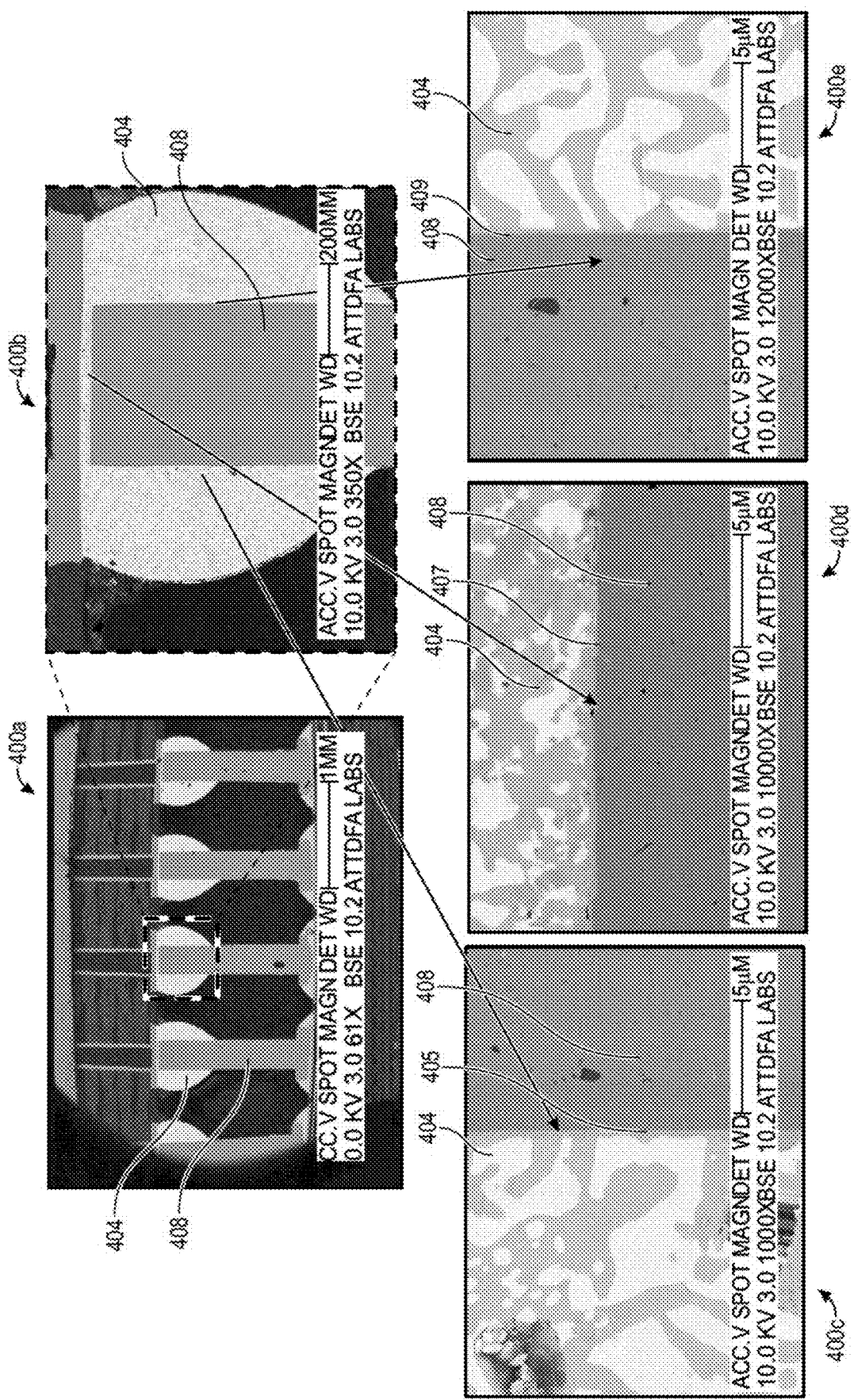
FIG. 4 illustrates x-ray images of a plurality of pins inserted into a plurality of solder elements, in accordance with embodiments.

FIG. 4 illustrates x-ray images of a plurality of pins inserted into a plurality of solder elements, in accordance with embodiments. Diagram 400a shows a side view x-ray of a pin 408, which may be similar to pin 208 of FIG. 2, that has been inserted into a BGA solder 404 using the techniques described herein.

Diagram 400b is a zoom in of the dotted line area of the x-ray diagram 400a to show a BGA solder 404 and a pin 408 in greater detail. As shown, the BGA solder 404 appears to surround the pin 408 in a uniform and even manner, indicating a clean physical and electrical coupling between the pin 408 and the BGA solder 404. The elemental analysis of the interface shows a uniform intermetallic compound formation between the solder and the pin surface, which is an indication of healthy solder bond.

Diagram 400c shows a zoom in of an area of a left side of the pin 408 as shown by the arrow that gives a greater detail to the interface line 405 between the BGA solder 404 and the pin 408. The interface line 405 looks clean, showing no air pockets or other gaps between the pin 408 and the BGA solder 404. The elemental analysis of the interface shows a uniform intermetallic compound formation between the solder and the pin surface, which is an indication of healthy solder bond.

Diagram 400d shows a zoom in of an area near the top of the pin 408 as shown by the arrow that gives a greater detail of the interface line 407 between the top of the pin 408 and the BGA solder 404. Although the interface line 407 is not perfectly horizontal given the structure of the top of pin 408, it is seen that the interface line 407 looks clean, showing no air pockets or other gaps between the pin 408 and the BGA solder 404. The elemental analysis of the interface shows an intermetallic compound formation between the BGA solder 404 and the pin 408 surface, which is an indication of healthy solder bond.

Similarly, diagram 400e shows a zoom in of an area near the right side of the pin 408 as shown by the arrow that gives a greater detail to the interface line 409 between the BGA solder 404 and the pin 408. The interface line 409 looks clean, showing no air pockets or other gaps between the pin 408 and the BGA solder 404. The elemental analysis of the interface shows a intermetallic compound formation between the solder and the pin surface, which is an indication of healthy solder bond.

As shown in FIG. 4, the pin 408 generally has a cylindrical shape. In embodiments, other geometries of pins 408 may be used, for example a rectangle or partial rectangle shape, pyramid shape, or cone shape may be used.

Figure 5:
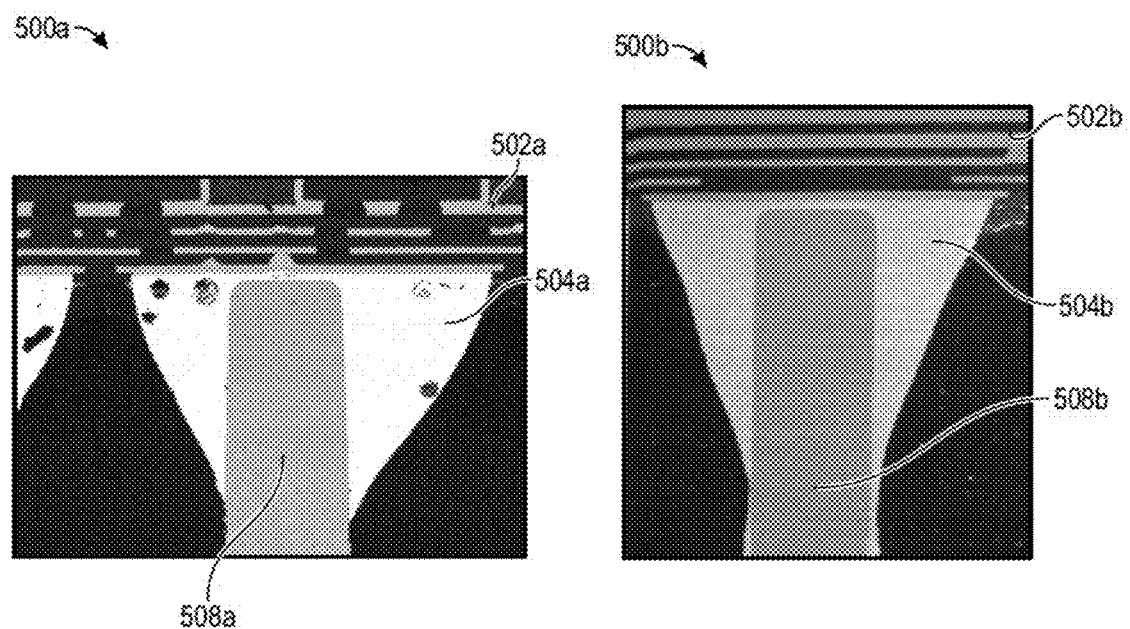
FIG. 5 illustrates x-ray images of a pin after it has been inserted one time into a solder element and after it has been withdrawn and inserted five times into the solder element, in accordance with embodiments.

FIG. 5 illustrates x-ray images of a pin after it has been inserted one time into a solder element and after it has been withdrawn and inserted five times into the solder element, in accordance with embodiments. Diagram 500a shows an example x-ray of a pin 508a that has been inserted into a BGA solder 504a attached to package 502a for the first time using techniques as described herein. Diagram 500b shows an example x-ray of a pin 508b that has been inserted, withdrawn and reinserted five times into a BGA solder 504b attached to a package 502b using techniques as described herein.

As shown, the joint formed between pin 508a and BGA solder 504a, as well as the joint formed between pin 508b and BGA solder 504b is a good formation without gaps or pockets. Even with this good formation, the one-cycle BGA solder 504a appears to have a greater concentration of solder near the package 502a comparison to BGA solder 504b that appears to have a greater concentration of solder along the pin 508b further away from package 502b.

Figure 6:
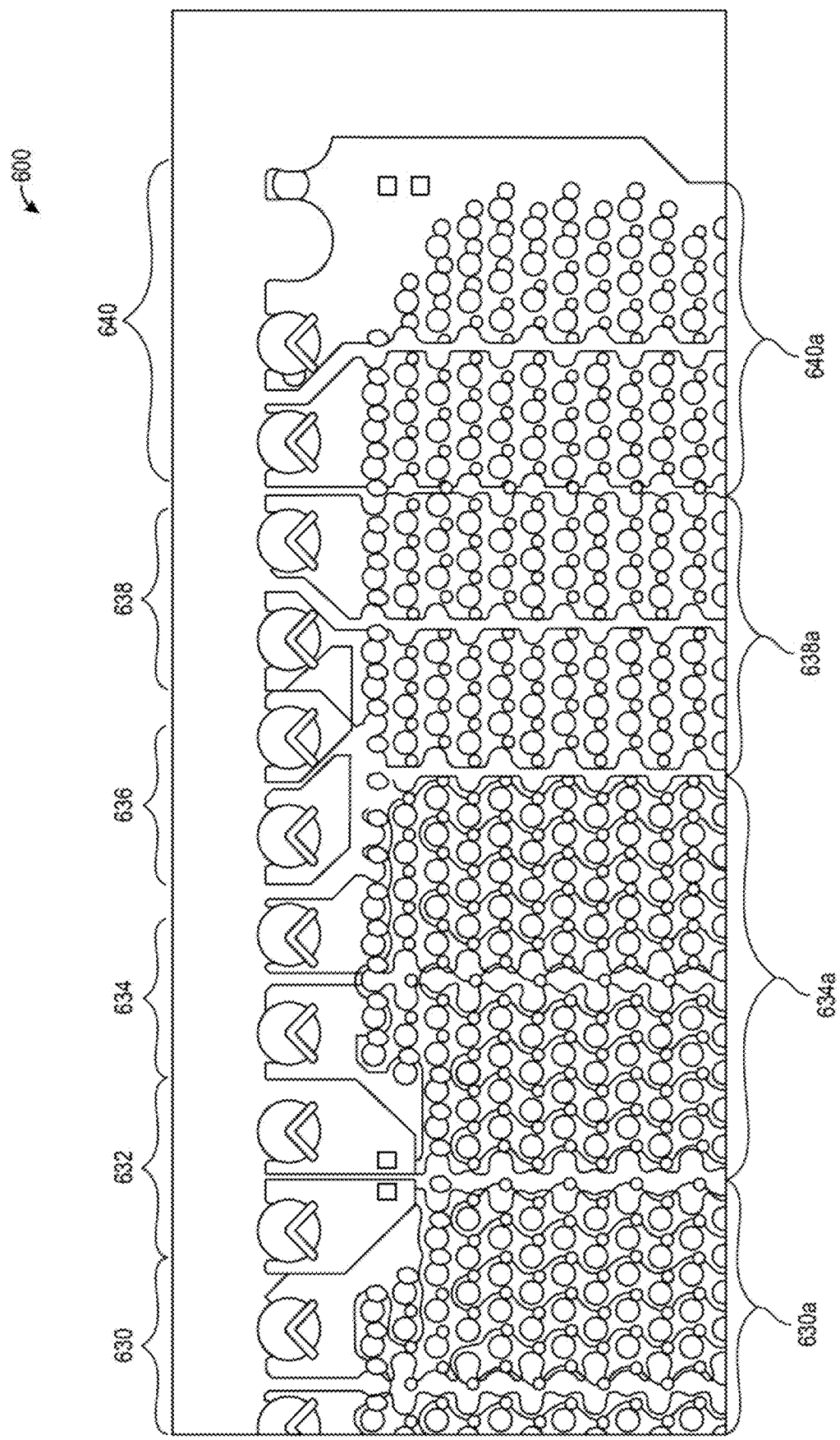
FIG. 6 illustrates a diagram of an interposer that includes multiple layer of heaters to heat a plurality of pins, in accordance with embodiments.

FIG. 6 illustrates a diagram of an interposer that includes multiple layer of heaters to heat a plurality of pins, in accordance with embodiments. Diagram 600 shows an interposer, which may be similar to interposer 106 of FIG. 1, that has a plurality of electrical connections 630, 634, 638, 640 used to power heaters 630a, 634a, 638a, 640a, which may be similar to heaters 112 of FIG. 1 or heaters 212 of FIG. 2. In embodiments, electrical connections, 632, 636 may be used to power heaters (not shown) that are located elsewhere on the interposer.

In embodiments, the electrical connections 630, 632, 634, 636, 638, 640 that are thermally coupled to and may be energized to heat pins such as pin 108 of FIG. 1 when either attaching or detaching the pin 108 to or from a BGA solder 104. In embodiments, the electrical connections 630, 632, 634, 636, 638, 640 may be energized by a tool such as controller tool 116 of FIG. 1 that may be attached to a package 102 for either attaching or detaching the package 102 to an interposer 106. In embodiments, the controller tool 116 may electrically couple with electrical connections 630, 632, 634, 636, 638, 640.

In embodiments, heaters associated with electrical connections 630, 632, 634, 636, 638, 640 may be located in different positions within the interposer, or maybe overlapped to provide additional heating capacity to a group of pins. In embodiments, the electrical connections 630, 632, 634, 636, 638, 640 may be pads on the interposer 600, or may be edge tabs (not shown), that include, for example, gold, copper, or other suitable electrical connector material.

Figure 7:
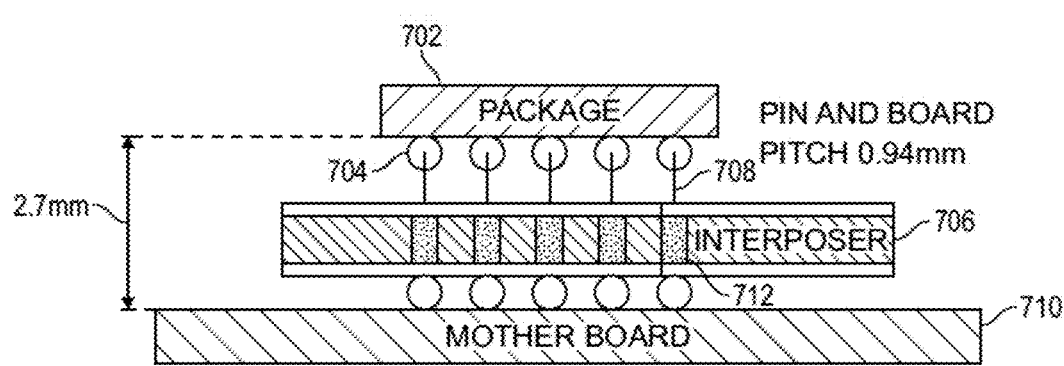
FIG. 7 illustrates an example measurement of resonances of heated pin vs. land grid array (LGA) implementations, in accordance with embodiments.
Figure 7:
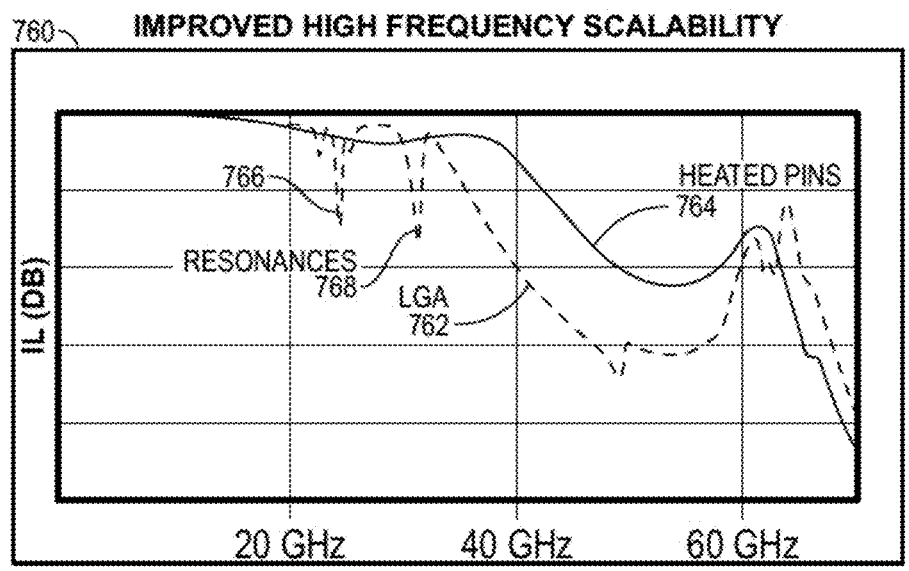

FIG. 7 illustrates an example measurement of resonances of heated pin vs. LGA implementations, in accordance with embodiments. Diagram 760 shows results of resonances at various operational frequencies of a package 702 coupled with an interposer 706. As shown, a BGA 704 of the package 702 is coupled with pins 708 of interposer 706 using pin heating techniques described herein. The package 702 may be similar to package 102 and BGA 704 may be similar to BGA 104 of FIG. 1. Pin 708 may be similar to pins 108 and interposer 706 may be similar to interposer 106 of FIG. 1. Prior to insertion of the pins 708 into the BGA 704, the pin 708s may be heated by heater 712, which may be similar to heaters 112 of FIG. 1 to melt the BGA 704 during insertion. The interposer 706 may be coupled with a motherboard 710. As shown, the bottom surface of the package 102 is approximately 2.7 mm from a top surface of the motherboard 710.

The diagram 760 shows results of an operational comparison vs. a legacy implementation (not shown) of an LGA. As shown, resonances associated with simple vertical interconnects operation 764 show improved high-frequency performance versus the LGA operation 762. In particular, resonance points 766, 768 between 20 GHz and 40 GHz frequencies with the LGA operation 762 indicate resonance issues. In comparison, simple vertical interconnects operation 764 show little to no resonances.

Figure 8:
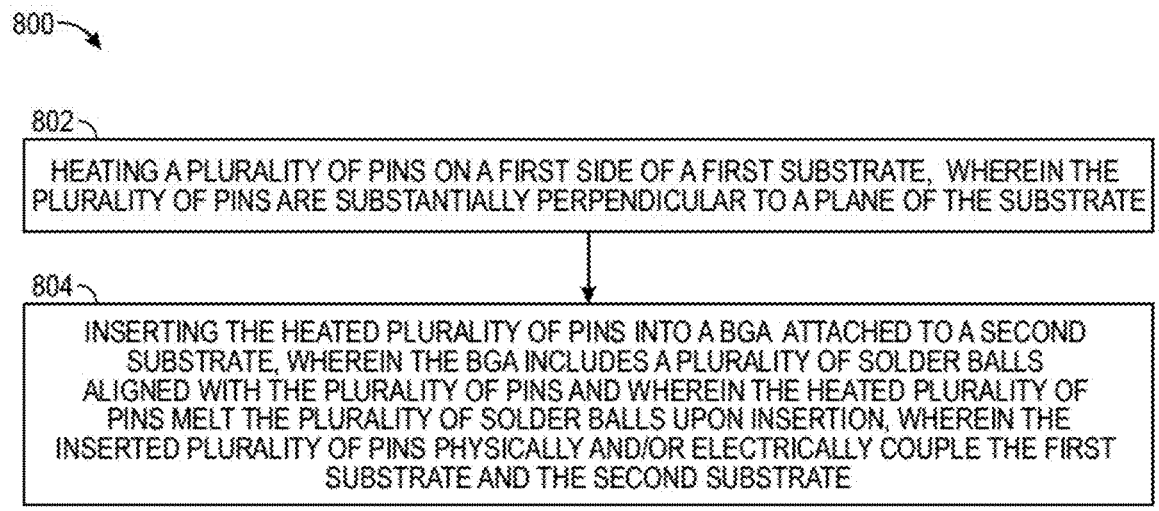
FIG. 8 illustrates an example of a process to couple of first substrate and a second substrate, in accordance with embodiments.

FIG. 8 illustrates an example of a process to couple of first substrate and a second substrate, in accordance with embodiments.

Process 800 may be performed by one or more elements, techniques, or systems that may be found in FIGS. 1-7.

At block 802, the process may include heating a plurality of pins on a first side of a first substrate, wherein the plurality of pins are substantially perpendicular to a plane of the substrate. In embodiments, the first substrate may be similar to interposer 106 of FIG. 1, or interposer 206 of FIG. 2. In embodiments, the first substrate may also be a PCB, such as PCB 110 of FIG. 1. The plurality of pins may be similar to pins 108 of FIG. 1, or 208 FIG. 2 that are coupled to the interposer.

In embodiments, the plurality of pins may be heated using heating elements similar to heating elements 112 within interposer 106 of FIG. 1, or heating elements 212 within interposer 206 of FIG. 2. In other embodiments, the plurality of pins may be heated using an induction technique where electric coils induce eddy currents within the plurality of pins, or in a base, such as base 107 of FIG. 1, that is thermally coupled with the pin 108. In embodiments, the inductive electric coil may be part of a controller tool, such as controller tool 116 of FIG. 1, that may be used to facilitate the insertion or removal of pins from a BGA solder such as BGA solder 104 of FIG. 1. In other embodiments, the plurality of pins may be heated by using a thermally conductive element (not shown) that may couple with a thermal coupling (not shown) at the edge of the substrate. When heat is applied to the thermal coupling, the thermal coupling will then heat the plurality of pins.

In embodiments, the pins may be perpendicular to the first substrate by using a carrier such as carrier 105 of FIG. 1. In embodiments, this carrier may be made of plastic, or some other material that may have low electrical conductivity and high heat resistance. In embodiments, this carrier may be removed prior to joining the pins to a BGA solder. In embodiments, the carrier is non conducting to avoid shorting the pins 108 of FIG. 1.

At block 804, the process may include inserting the heated plurality of pins into a BGA attached to a second substrate, wherein the BGA includes a plurality of solder elements aligned with the plurality of pins and wherein the heated plurality of pins melt the plurality of solder elements upon insertion, wherein the inserted plurality of pins physically and/or electrically couple the first substrate and the second substrate. In embodiments, the BGA includes a plurality of solder elements and may be similar to BGA solder 104 of FIG. 1, 204 of FIG. 2, 404 of FIG. 4, or 504a, 504b of FIG. 5. The second substrate may be similar to package 102 of FIG. 1 or 202 of FIG. 2. The inserted plurality of pins may be similar to inserted pins 208 of FIG. 2, 308 of FIG. 3, 408 of FIG. 4, or 508a, 508b of FIG. 5.

The alignment of the plurality of solder elements with the plurality pins, as well insertion to physically and/or electrically couple the first substrate and the second substrate may be facilitated by a controller tool such as controller tool 116 of FIG. 1. The controller tool may be temporarily attached to the first substrate or the second substrate and may be used to align the first substrate and the second substrate during pin insertion or pin removal. The controller tool may also be used to insert or withdraw the plurality of pins into or from the plurality of solder elements.

Figure 9:
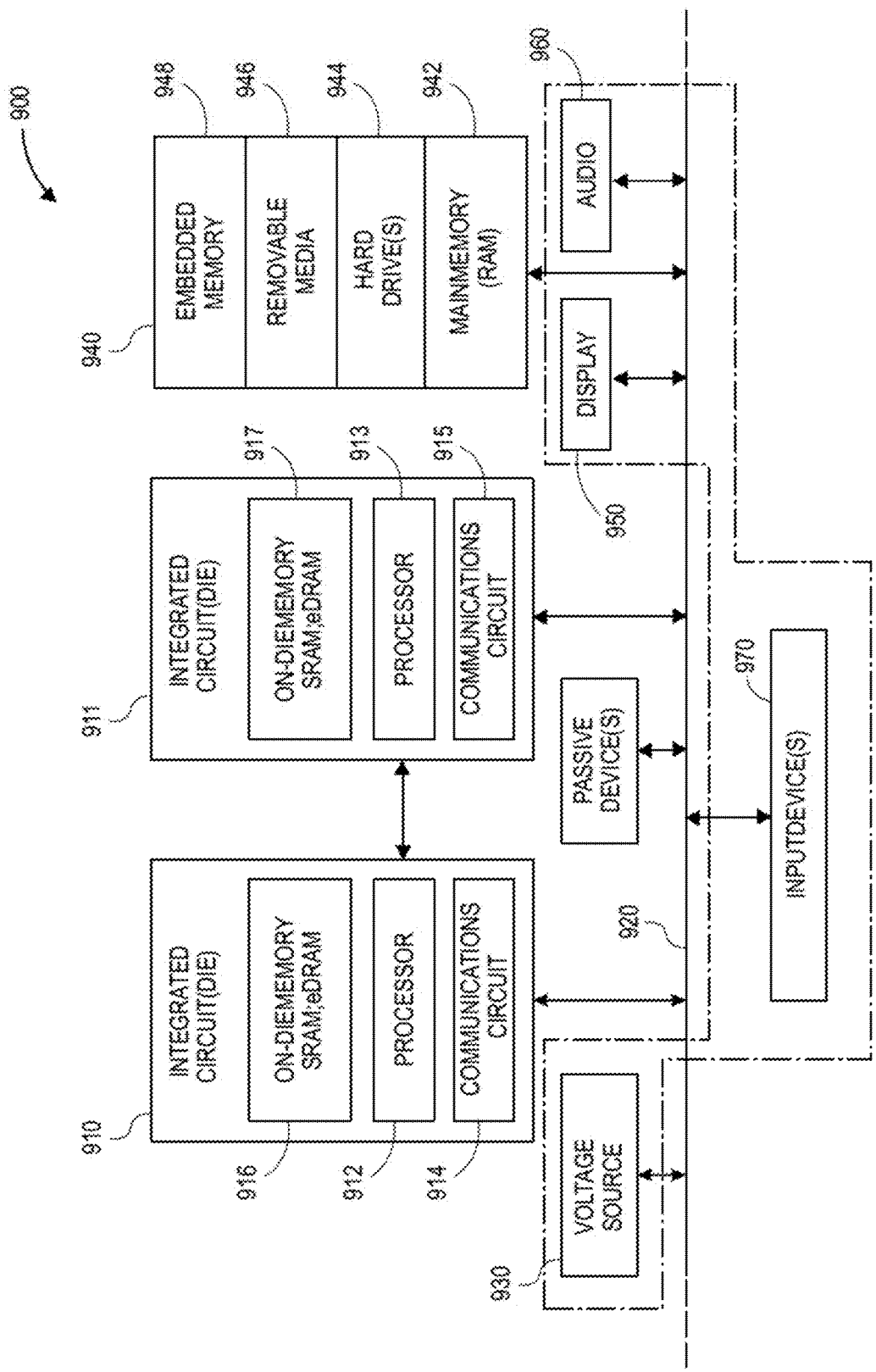
FIG. 9 schematically illustrates a computing device, in accordance with embodiments.

FIG. 9 schematically illustrates a computing device, in accordance with embodiments. The computer system 900 (also referred to as the electronic system 900) as depicted can embody heated pins to couple to or decouple from solder elements, according to any of the several disclosed embodiments and their equivalents as set forth in this disclosure. The computer system 900 may be a mobile device such as a netbook computer. The computer system 900 may be a mobile device such as a wireless smart phone. The computer system 900 may be a desktop computer. The computer system 900 may be a hand-held reader. The computer system 900 may be a server system. The computer system 900 may be a supercomputer or high-performance computing system.

In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912 that can be of any type. As used herein, the processor 912 may mean any type of circuit such as, but not limited to, a microprocessor, a microcontroller, a graphics processor, a digital signal processor, or another processor. In an embodiment, the processor 912 includes, or is coupled with, heated pins to couple to or decouple from solder elements, as disclosed herein. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM).

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950, an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, the integrated circuit 910 can be implemented in a number of different embodiments, including a package substrate having heated pins to couple to or decouple from solder elements, according to any of the several disclosed embodiments and their equivalents, an electronic system, a computer system, one or more methods of fabricating an integrated circuit, and one or more methods of fabricating an electronic assembly that includes a package substrate having heated pins to couple to or decouple from solder elements, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having heated pins to couple to or decouple from solder elements embodiments and their equivalents. A foundation substrate may be included, as represented by the dashed line of FIG. 9. Passive devices may also be included, as is also depicted in FIG. 9.

EXAMPLES

The following paragraphs describe examples of various embodiments.

Example 1 is an apparatus comprising: a substrate with a first side and a second side opposite the first side; a plurality of pins on the first side that are substantially perpendicular to a plane of the substrate; and wherein the plurality of pins, when heated, are to physically couple with or to physically decouple from a plurality of solder elements when the heated plurality of pins are inserted into or removed from the plurality of solder elements.

Example 2 includes the apparatus of example 1, wherein the substrate further includes a thermal element thermally coupled with the plurality of pins to heat the plurality of pins.

Example 3 includes the apparatus of example 2, wherein the thermal element is an electric heating element.

Example 4 includes the apparatus of example 3, further comprising an electrical input and an electrical output coupled to the electric heating element to power the electric heating element.

Example 5 includes the apparatus of example 2, wherein the thermal element is a thermal conductor to conduct heat to the at least the portion of the plurality of pins.

Example 6 includes the apparatus of example 5, further comprising a thermal input thermally coupled with the thermal conductor, the thermal input to receive thermal energy external to the substrate.

Example 7 includes the apparatus of example 5, wherein the thermal conductor is heated through induction.

Example 8 includes the apparatus of example 1, wherein the plurality of pins is heated through induction.

Example 9 includes the apparatus of any one of examples 1-8, wherein the substrate includes one or more alignment features to align a package with a ball grid array (BGA) on one side of the package with the plurality of pins.

Example 10 includes the apparatus of any one of examples 1-8, wherein the second side of the substrate includes a BGA to attach the substrate to another substrate.

Example 11 is a system comprising: a substrate including: a first side and a second side opposite the first side; a plurality of pins on the first side that are substantially perpendicular to a plane of the substrate; and wherein the plurality of pins, when heated, are to physically couple with or to physically decouple from a ball grid array (BGA) when inserted into or removed from the BGA; and a package with a BGA on a side of the package, the BGA to physically couple with the plurality of pins.

Example 12 includes the system of example 11, wherein the substrate further includes a thermal element thermally coupled with at least a portion of the plurality of pins to heat the at least the portion of the plurality of pins.

Example 13 includes the system of example 12, wherein the thermal element is an electric heating element.

Example 14 includes the system of example 13, further comprising one or more electrical connections on the substrate coupled to the electric heating element to power the electric heating element.

Example 15 includes the system of example 11, wherein the plurality of pins is heated through induction.

Example 16 includes the system of example 11, wherein the substrate includes one or more alignment features to align the BGA with the plurality of pins.

Example 17 includes the system of example 16, further comprising a controller tool coupled with the package to align the BGA with the plurality of pins or to facilitate heating of the plurality of pins during insertion or removal of the pins from the BGA.

Example 18 includes the system of example 17, wherein the controller tool further includes an induction coil to heat the plurality of pins.

Example 19 includes the system of any one of examples 11-18, wherein material in the pins include gold, tin, copper, iron, or nickel.

Example 20 includes the system of any one of examples 11-18, wherein the pins are rods.

Example 21 is a method, comprising: heating a plurality of pins on a first side of a first substrate, wherein the plurality of pins are substantially perpendicular to a plane of the substrate; inserting the heated plurality of pins into a ball grid array (BGA) attached to a second substrate, wherein the BGA includes a plurality of solder elements aligned with the plurality of pins and wherein the heated plurality of pins melt the plurality of solder elements upon insertion; and wherein the inserted plurality of pins physically and/or electrically couple the first substrate and the second substrate.

Example 22 includes the method of example 21, wherein heating the plurality of pins on the first side of the first substrate further includes inductively heating the plurality of pins on the first side of the first substrate.

Example 23 includes the method of example 21, wherein heating the plurality of pins on the first side of the first substrate further includes applying current to one or more heating elements in the first substrate located proximate to and thermally coupled to the plurality of pins.

Example 24 includes the method of example 21, further comprising: heating the plurality of pins on the first side of the first substrate; removing the heated plurality of pins from the BGA.

Example 25 includes the method of any one of examples 21-24, further comprising: attaching a controller tool to the second substrate to align the BGA with the plurality of pins or to facilitate heating of the plurality of pins during insertion of the pins into the BGA.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a substrate with a first side and a second side opposite the first side;
   a plurality of pins on the first side of the substrate;
   a plurality of electric heaters embedded within the substrate, wherein the plurality of electric heaters are thermally coupled with the plurality of pins;
   a plurality of electrical input and electrical output pairs; and
   wherein each one of the plurality of electrical input and electrical output pairs is electrically coupled with a corresponding one of a plurality of subsets of the plurality of electric heaters.

2. The apparatus of claim 1, wherein each one of the plurality of electric heaters is thermally coupled with a corresponding one of the plurality of pins.

3. The apparatus of claim 1, wherein a subset of the plurality of electric heaters are thermally coupled with one of the plurality of pins.

4. The apparatus of claim 1, wherein at least one of the plurality of pins includes a pad, wherein the pad is on the first side of the substrate, wherein the pad is directly thermally coupled with a pin, and wherein the pad surrounds at least one of the plurality of pins.

5. The apparatus of claim 1, wherein the plurality of pins is substantially perpendicular to the first side of the substrate.

6. The apparatus of claim 1, wherein the second side of the substrate includes a BGA to attach the substrate to another substrate.

7. A system comprising:
   a substrate including:
     a first side and a second side opposite the first side;
     a plurality of pins on the first side of the substrate that are substantially perpendicular to the first side of the substrate;
     a plurality of heaters embedded within the substrate, wherein the plurality of heaters are thermally coupled with the plurality of pins, and wherein a first subset of the plurality of heaters overlaps a second subset of the plurality of heaters with respect to a plane of the first side of the substrate; and
     wherein the plurality of pins, when heated, are to physically couple with or to physically decouple from a ball grid array (BGA) when the plurality of pins are inserted into or removed from the BGA; and
   a package with the BGA on a side of the package.

8. The system of claim 7, wherein each one of the plurality of heaters is thermally coupled with a corresponding one or more of the plurality of pins.

9. The system of claim 8, wherein the plurality of heaters are a plurality of electric heaters.

10. The system of claim 9, further comprising one or more electrical connections coupled with the plurality of electric heaters.

11. The system of claim 7, wherein the substrate or the package includes one or more alignment features to align the BGA of the package with the plurality of pins on the substrate.

12. The system of claim 7, further comprising a controller tool physically coupled with the package to align the BGA with the plurality of pins or to facilitate heating of the plurality of pins during insertion or removal of the plurality of pins from the BGA.

13. The system of claim 12, wherein the controller tool electrically couples with the plurality of heaters.

14. The system of claim 13, wherein the plurality of pins include a selected one or more of: gold, tin, copper, iron, or nickel.

15. The system of claim 7, wherein the plurality of pins are rods.

16. An apparatus comprising:
a substrate with a first side and a second side opposite the first side;
a plurality of pins on the first side of the substrate;
a plurality of heaters embedded within the substrate, wherein the plurality of heaters are thermally coupled with the plurality of pins, and wherein a first subset of the plurality of heaters overlaps a second subset of the plurality of heaters with respect to a plane of the first side of the substrate.

17. The apparatus of claim 16, wherein each one of the plurality of heaters is thermally coupled with a corresponding one of the plurality of pins.

18. The apparatus of claim 16, wherein the plurality of heaters further include a plurality of electric heaters.

19. The apparatus of claim 18, further comprising an electrical input and an electrical output coupled to the plurality of electric heaters.

20. The apparatus of claim 19, wherein the electrical input and the electrical output further comprise a plurality of electrical input and electrical output pairs; and
wherein each one of the plurality of electrical input and electrical output pairs is electrically coupled with a corresponding one of a plurality of subsets of the plurality of electric heaters.

21. The apparatus of claim 16, wherein a subset of the plurality of heaters are thermally coupled with one of the plurality of pins.

22. The apparatus of claim 16, wherein at least one of the plurality of pins includes a pad, wherein the pad is on the first side of the substrate, wherein the pad is directly thermally coupled with a pin, and wherein the pad surrounds at least one of the plurality of pins.

23. The apparatus of claim 16, wherein the plurality of pins is substantially perpendicular to the first side of the substrate.

24. The apparatus of claim 16, wherein the second side of the substrate includes a BGA to attach the substrate to another substrate.

* * * * *